United States Patent [19]

Jabben

[11] 4,392,181
[45] Jul. 5, 1983

[54] CIRCUIT BOARD AND CONTACT ASSEMBLIES

[75] Inventor: Gary D. Jabben, Shreveport, La.

[73] Assignee: Western Electric Company, Inc., New York, N.Y.

[21] Appl. No.: 259,748

[22] Filed: May 1, 1981

[51] Int. Cl.³ .............................................. H05K 1/18
[52] U.S. Cl. .................................... 361/401; 339/17 E;
  339/176 MP; 361/405; 361/406; 361/413
[58] Field of Search ............... 361/401, 405, 406, 413;
  339/17 C, 17 CF, 17 LC, 17 E, 176 MP

[56] References Cited

U.S. PATENT DOCUMENTS

| | | | |
|---|---|---|---|
| 2,603,681 | 7/1952 | Salisbury | 361/406 X |
| 3,143,787 | 8/1964 | Babbe | 339/17 E X |
| 3,489,952 | 1/1970 | Hinchey | 361/401 X |
| 3,500,428 | 3/1970 | Allen | 361/401 X |
| 3,846,743 | 11/1974 | Garver | 361/406 X |
| 4,281,361 | 7/1981 | Patz et al. | 174/68.5 X |

FOREIGN PATENT DOCUMENTS 977871  11/1975  Canada .............................. 339/17 C Primary Examiner—R. R. Kucia
Attorney, Agent, or Firm—J. L. Landis; J. J. Jordan

[57] ABSTRACT

A row of connectors 14 is assembled on a printed circuit board 11 by inserting a leg section 41 of each terminal 14 into a mounting aperture 32 and bending a flat contact portion 42 of each terminal 14 to fit into a pocket 47 formed in the surface of the board. Printed circuit conductors 13 are next screened onto the board 11 with a portion of the conductors positioned over some of the contact portions 42 of terminals 14 to provide edge connections for the printed circuits 12. Metal strips conductors 13 are then fastened to the board 11 and end portions thereof are welded to the contact portions 42 of other terminals 14 to provide edge connections for the metal strips conductors 13.

4 Claims, 8 Drawing Figures

CIRCUIT BOARD AND CONTACT ASSEMBLIES

TECHNICAL FIELD

This application relates generally to printed circuit board and contact assemblies, and particularly to interconnect terminal arrangements for connecting printed circuit conductors and other circuit elements mounted on a circuit board to external circuits such as, for example, in the manufacture of an X-Y matrix switch assembly.

BACKGROUND

In the manufacture of electronically switched dial assemblies for multifrequency push-button dial pads for telephone sets, a switch assembly is formed consisting of an X-Y matrix of conductive members mounted on a conventional plastic substrate. In one example, the X or row conductors comprise screened printed circuit conductors deposited on the substrate in a first pattern, and the Y or column conductors comprise a plurality of flat metal strips adhesively bonded to the substrate in crossing patterns normally isolated from the printed circuit conductors by an insulating layer. The flat metal strips carry sets of click discs, or curved dome shaped spring members that can be depressed by a telephone push button to make contact through an aperture in the insulating layer with an underlying dot portion of one of the printed circuit conductors to, in effect, close a switch between the X and Y conductors to operate the dialing circuits. In such an X-Y matrix conductor array, it is necessary to provide some form of terminal or connector assembly for connecting the ends of the individual X and Y conductors to external circuitry, preferably an edge-connector type of terminal assembly having a row of parallel terminals arranged along a front edge of the board that can be attached to a second printed circuit card carrying the dialing circuitry, or otherwise easily connected to external circuits of some other type.

SUMMARY OF THE INVENTION

A specific object of the invention is to provide connector assemblies of such type, in which a plurality of interconnect terminals of a single special design may first be assembled with the board, wherein screened printed circuits may thereafter be applied to the substrate and attached head portions of the terminals by thermal bonding, and wherein contact strips may thereafter be fastened to the board and attached to head portions of other selected terminals by welding.

More general objects are to provide assemblies of circuit boards and terminal members for connecting circuit members on a substrate to external circuitry, particularly edge-connector arrangements for complex printed circuit boards having both printed circuits and metal contact strips deposited or mounted on a single surface of a planar substrate.

With the foregoing and other objects in view, assemblies in accordance with certain features of the invention include a substrate having a plurality of mounting apertures formed therein. A plurality of interconnect terminals are inserted into the apertures so that an elongated body portion of each terminal is mounted in an associated aperture, and so that a 90° extending contact tip section of each terminal fits flat against the outer surface of the substrate adjacent to the aperture. A plurality of conductive circuit elements are then formed on the outer surface of the substrate so that a contact end section of each circuit element overlaps the contact tip of a selected terminal, and the contact end portion is then attached to the contact tip to provide mechanical and electrical connection between the conductive elements and the associated terminals.

Preferably, the contact tip section is formed as a thin flat tab connected to the body section of the terminal and bent at a 90° angle thereto, and the substrate is formed with thin flat pockets in the outer surface adjacent to the apertures for receiving the contact tabs with the outer surface of the tabs projecting a slight distance beyond the outer surface of the substrate adjacent to the pocket. With this arrangement, screened printed circuit conductors may be deposited in desired patterns on the substrate so that end contact portions thereof overlap the contact tips and are thereafter bonded by heating to cure the conductors. Metal contact strips, such as the click-disc strips discussed above, may then be adhesively bonded to the surface of the substrate in desired patterns isolated from the printed circuit conductors so that end contact portions thereof overlap the contact tips of the terminals and are attached thereto by welding.

Other objects, advantages and features of the invention will be apparent from the following detailed description of a specific example and embodiment thereof when read in conjunction with the accompanying drawings.

DETAILED DESCRIPTION

Figure 1:
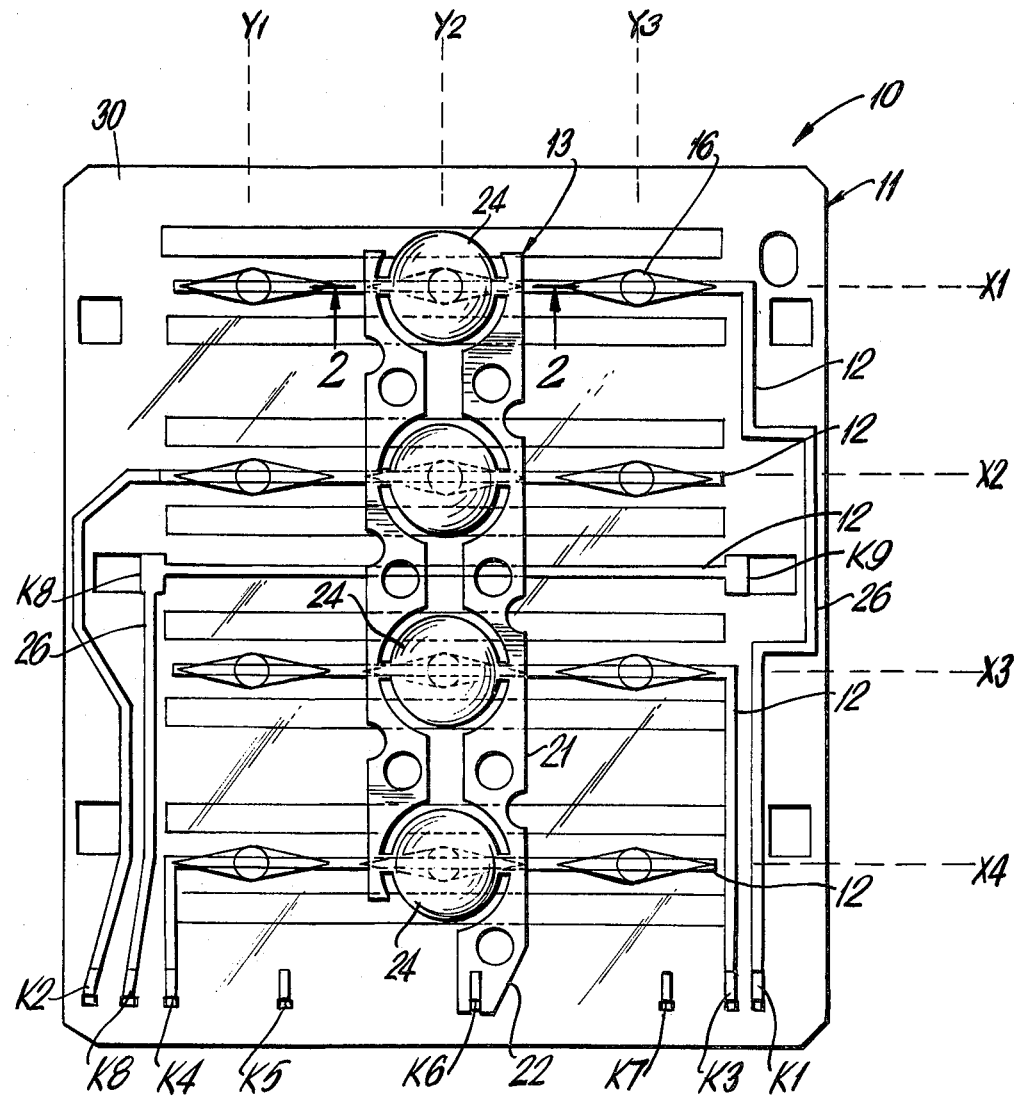
FIG. 1 is a plan view of a printed circuit board for an electronically switched dial assembly in accordance with a specific embodiment of the invention, illustrating also in exploded position a contact strip about to be assembled with the board.
Figure 2:
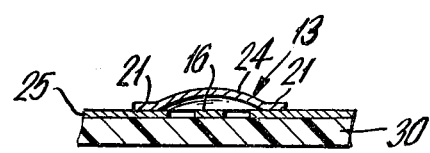
FIG. 2 is a fragmentary vertical section along line 2—2 of FIG. 1, after assembly of an insulating spacer and the contact strip with the board.
Figure 3:
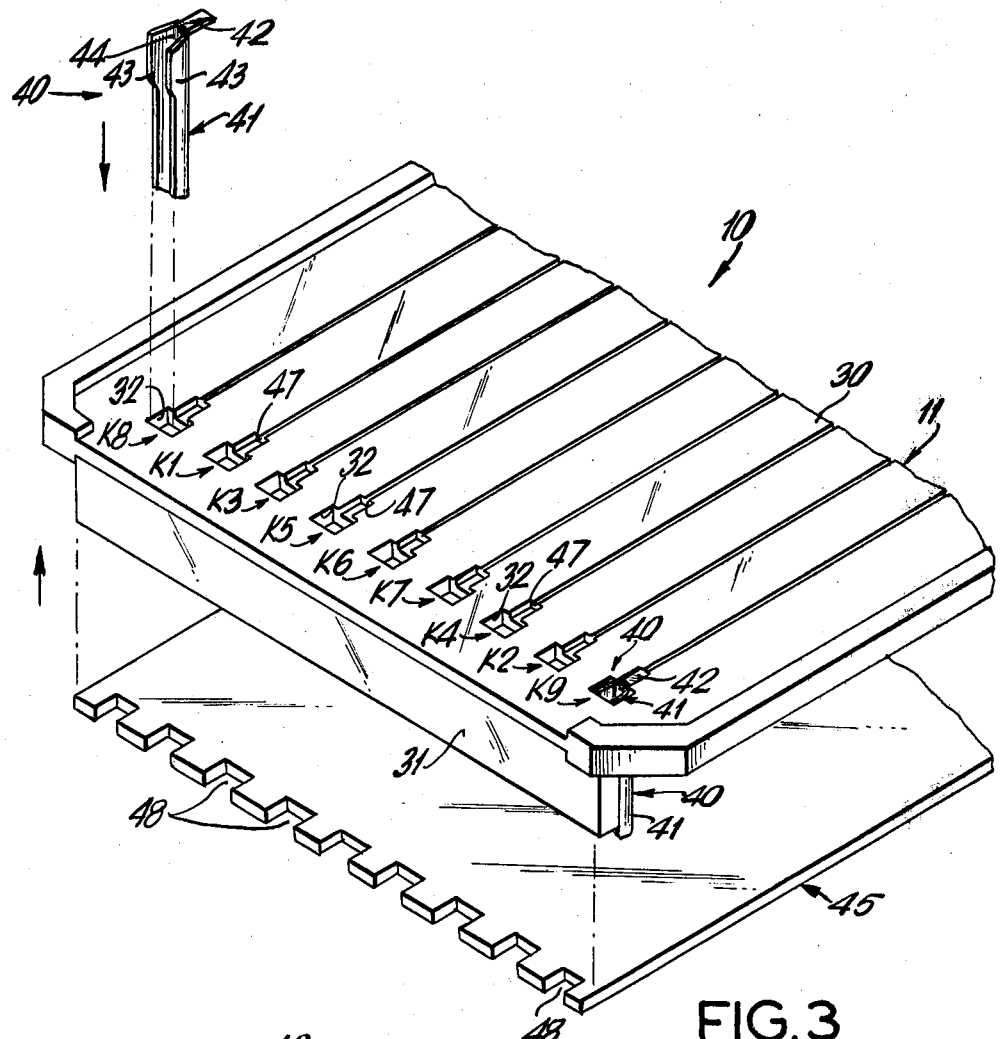
FIG. 3 is an exploded perspective view illustrating a front portion of the board prior to the deposition printed circuit conductors thereon, interconnected terminal members that are assembled with the board, and a second printed circuit card that is subsequently assembled with the board to complete the dial assembly.

Referring now in detail to the drawings and particularly to FIGS. 1–3, there is illustrated a circuit board and contact assembly 10 manufactured in accordance with one specific embodiment of the invention and including a circuit board 11 having a plurality of printed circuit conductors 12—12 deposited on a surface of the board in desired patterns, a plurality of thin flat metal conductive strips 13—13 mounted on the same surface of the board in desired patterns isolated from the printed circuit conductors, and a plurality of interconnect terminals 14—14 in accordance with the invention mounted to the board 11 preferably along one edge thereof for connecting the printed circuit conductors 12 and the conductive strips 13 to external circuitry. In the example illustrated, the assembly 10 forms part of an electronically switched dial unit for a push-button telephone dial, in which the printed circuit conductors 12—12 and conductive strips 13—13 are arranged in an X-Y matrix of overlapping conductive elements as illustrated for providing a dialing connection when a switch contact portion of one of the strips 13 is operated to make contact with a contact portion of one of the underlying conductors 12 as described in further detail hereafter.

In this example, a set of four printed circuit row conductors 12—12 are deposited on an "outer" surface of the board 11 (the upper surface as illustrated in FIGS. 2 and 3) in a pattern as shown in FIG. 1, in which each of the four row conductors is connected to a set of three printed-circuit conductive "dots" 16—16, which serves as switch contacts and which correspond in number and layout on the board to the twelve push buttons of a standard telephone dial pad. For example, the top row conductor 12, on matrix row axis $X_1$, is connected to each of three spaced dots 16 corresponding to the buttons "1," "2" and "3" of the dial pad, as is conventional. For connecting the printed circuit conductors 12—12 to external dialing circuitry, the row conductors 12 are turned downward as shown in FIG. 1, and are brought out to contact positions designated K-1 to K-4 along a "front" edge of the board, where an end contact portion of each printed circuit 12 is mechanically and electronically connected to a head portion of an associated one of the interconnect terminals 14 as described in detail hereafter, to permit connection of the conductors 12 to the external dialing circuit.

In this example, the conductive strips 13 comprise a set of three parallel "click-disc" conductor strips fastened on the board 11 above the printed circuit row conductors 12—12, such as by adhesive bonding, and running along column axis $Y_1$-$Y_3$ so that each strip 13 is aligned with a vertical column of four of the conductive dots 16—16 as illustrated in FIG. 1. The strips 13 are made of a thin conductive metal such as steel, and have continuous edge portions 21—21 that function as column conductors for connecting any of the four contact dots 16 in each row to an associated column contact position K5, K6 or K7 also provided along the front edge of the board 11 and preferably aligned in a horizontal row, as illustrated, with the X-conductor contact positions K-1 to K-4. In this example, each contact strip 13 is formed with an end contact position 22 at the front or lower end thereof as illustrated in FIG. 1, which is mechanically and electrically connected to a head portion of an associated one of the interconnect terminals 14 as described hereafter, to connect the Y-conductor strips 13 to the dialing circuitry.

Each of the strips 13 is formed with a set of four "click discs" 24 that are joined to the edge portions 21 by thin webs and are centered over the contact dots 16 as illustrated. As is conventional, the discs 24 are curved, dome-shaped spring members normally spaced from the dots 16 but which can be depressed by the associated push-button mechanism of the telephone dial to make contact with the underlying contact dots 16 so as to close a selected switch contact (24-16). Thus, contact can be made between any selected combination of the row conductors 12 and the column conductors 13 as is generally conventional in an X-Y switch matrix. The click-disc strips 13 are isolated from the printed circuit board 11 and the underlying printed circuit conductors 12 by a thick insulating layer such as a Polyester tape 25 (FIG. 2), which is adhesively bonded to the circuit board after the printed circuit conductors 12 are deposited and before the click-disc strips 13 are applied. The tape 25 has a pattern of holes to permit the click discs 24 to contact the dots 16 as required.

The circuit also includes an additional printed circuit conductor 26, as illustrated in FIG. 1 and which functions as an electrostatic shield conductor for the circuit. The conductor 26 terminates in two additional contact areas K-9, K-10 for connections to an electrostatic shield via one additional terminal 14—14 arranged on the circuit board as illustrated in FIG. 3.

In accordance with certain specific aspects, the invention relates to methods of making such an assembly of a printed circuit board 11 including an array of both printed circuit conductors 12 and overlapping metal strip conductors 13, and for attaching both types of conductive element to a single design to interconnect terminal 14 mounted in the board, to provide for connection of the conductors on the board 11 to external circuitry, preferably via an edge connector arrangement including a row of interconnect terminal positions such as K-1 to K-8 arranged along an edge of the circuit board 11 as illustrated in FIGS. 1 and 3.

Figure 4:
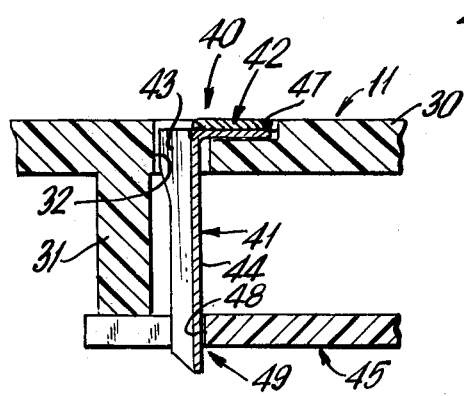
FIG. 4 is an enlarged fragmentary vertical section along line 4—4 of FIG. 3, illustrating a terminal member assembled with the board and with the second printed circuit card.
Figure 5:
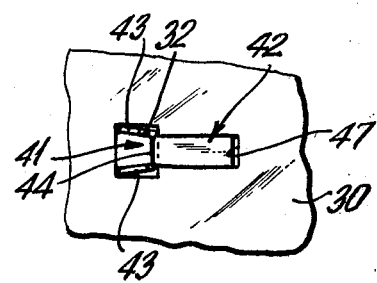
FIG. 5 is a fragmentary top view along line 5—5 of FIG. 4.
Figure 6:
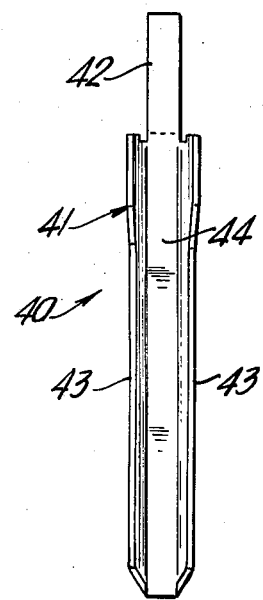
FIG. 6 is a front detail view of one of the terminals along line 6—6 of FIG. 4.

In the specific embodiment illustrated in FIGS. 3-5, the circuit board 11 includes a planar molded plastic substrate 30 such as a Polysuffone substrate, formed with a depending rectangular flange 31 along the front edge thereof, and having a set of eight rectangular mounting apertures 32 formed through the substrate at spaced intervals behind the flange 31 for receiving the interconnect terminals 14—14 and defining the board contact positions K-1 to K-8 previously described. In the assembly process, the interconnect terminals 14—14 are inserted into the mounting apertures 32—32 as indicated by arrow A in FIG. 3 so that an elongated body or leg section 41 of each terminal 14 is securely mounted in an associated aperture 32 as illustrated in FIGS. 3-5, prior to formation of the printed circuit conductors 12 and the assembly of the click-disc strips 13 with the board 11. As illustrated in FIGS. 3-5, and in detail in FIGS. 6-7, each terminal 14 includes an elongated leg section 41, that is inserted vertically into the aperture 32 as shown in FIG. 4, and a flat rectangular head section or contact tip 42 at the top, which is bent 90° to the vertical leg 41 to the horizontal position illustrated in FIGS. 4 and 7 so as to fit flat against the outer surface of the substrate 30 (the upper surface as viewed in FIGS. 3 and 4) adjacent to the mounting and so that a 90° extending aperture 32 and extending rearwardly from the aperture toward the areas on the substrate 30 where the printed circuit conductors 12 are to be deposited and the strips 13 are to be located.

The vertical leg 41 of each terminal 14 is formed with a tapered, generally U-shaped channel cross section, as illustrated in FIGS. 3 and 5, having side arms 43—43 initially projecting at an angle of about 27° from a base wall 44 of the channel. With this arrangement, the arms 43—43 are cammed together as the leg 41 enters the aperture 32, as indicated by arrows B in FIG. 5, to provide a tight fit of the upper portion of the terminal leg 41 in the aperture 32. The upper end portion of the vertical leg 41 is somewhat enlarged with respect to the lower portions of the leg, so that the leg is guided into the socket, and the metal of the terminal is sufficiently springy to provide a tight resilient fit of the terminal in the aperture 32 as shown in FIG. 4. At this time, the lower or tail end of the terminal 41 projects downward from the board 11 for eventual connection to external circuits contained on a second printed circuit card 45, as illustrated in FIGS. 3-4.

After such initial assembly of each terminal 14 in an associated mounting aperture 32 of the board 11, the flat contact section or tip 42 at the top fits into a thin flat recess or pocket 47 formed in the upper surface of the substrate 30 adjacent to and connecting with the adjacent aperture 32, preferably so that the upper surface of the contact tip 42 projects a slight distance such as one mil (0.0025 mm) above the surface of the substrate 30. Also, the upper surfaces of the contact tips 42 are preferably gold plated (nickel-gold) for subsequent connection to both the printed circuit conductors 12 and the contact tabs 22 of the click-disc strips 13 at the contact areas K-1 to K-8.

Figure 7:
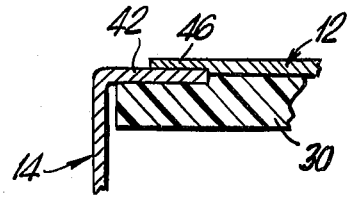
FIG. 7 is a fragmentary vertical section similar to FIG. 4, illustrating the manner of bonding an end contact portion of a screened printed circuit conductor to a contact tip of a selected terminal.

In the assembly process, the eight terminals 14 are first fastened to the board 11, and the contact tips 42 are bent over 90° into the pockets 47 as indicated by the arrow C in FIG. 4. Next, the printed circuit conductors 12—12 and 26 are deposited on the substrate, in this example by silk screening of a conductive ink on the substrate 30 as is generally well known, such as a conventional "thick film" conductive ink composed of silver flakes in an epoxy base which can be purchased from Ablestick Laboratories of Gardena, Calif. as "Silva Filled Conductive Chip Adhesive". In this process, contact end portions 46 of the printed conductors 12 and 26 are screened over and onto the upper surfaces of the contact tips 42 as illustrated in FIG. 7, to provide the required external contacts K-1 to K-8, K-9 and K-10 for the printed circuit conductors 12 when the pattern 12 is subsequently heated to cure the conductive ink and to bond the contact portions 46 to the gold-plated tips 42 of the associated terminals 14.

Figure 8:
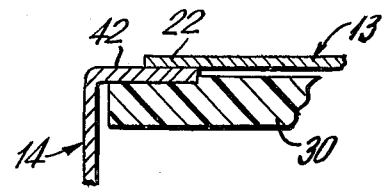
FIG. 8 is a view similar to FIG. 7, illustrating the manner of welding an end contact section of a flat metal conductive strip to the contact tip of another selected terminal.

After this, the Polyester insulating tapes 25 are adhesively fastened to the outer surface of the board 11 and the click-disc strips 13 are then assembled on top of the board as illustrated, so that the contact tab 22 at the front end of each strip 13 overlies an associated one of the terminal contact tips 42 as illustrated in FIG. 8. Next, the contact tabs 22 are welded to the adjacent flat contact tips 42 to make the three click-disc strip interconnections K-5, K-6 and K-7 at the center of the assembly. After contact welding, a Polyester cover sheet is bonded to the outer surface of the board to insulate the contact elements and to fasten the click-disc strips 13 firmly in place against the circuit board 11 to complete the final assembly 10 of the board 11, strips 13, and interconnecting terminals 14.

Later, this subassembly of circuit board 11, click-disc strips 13 and terminals 14 is assembled with the second printed circuit card 45 as shown in FIGS. 3-4. For this purpose, the depending flange 31 of the board 11 serves as a spacer or standoff to locate the lower board 45 a preset distance below the board 11 on assembly. For this purpose, the board 45 is formed with plated rectangular slots 48 along the front edge thereof which can be plugged into the lower or tail ends of the vertical legs 41 of the terminals 14 similarly to the assembly of the terminals with the first board 11. Subsequently, the lower end tips of the terminals 14 are soldered to the second board 45 to complete the dial assembly and to fasten the terminals 14 securely in place between the two circuit boards 11 and 45. The second board 45 carries the operating circuitry (switching circuits, tone signal generators, etc.) for the completed telephone dial unit.

While one specific example and embodiment of the invention has been described in detail hereinabove, it should be obvious that various modifications may be made from the specific details, steps and materials described without departing from the spirit and scope of the invention.

What is claimed is:

1. A circuit board and contact assembly which comprises:
    a substrate having a plurality of mounting aperatures formed therein;
    a flange depending from a lower surface of the substrate along an edge of the substrate;
    a plurality of interconnect terminals, each having an elongated body section mounted in an associated aperature comprising a tail section extending through the aperature and projecting from the lower surface of the substrate a distance greater than the flange depends from the the lower surface; and a 90° extending contact head section fitting flat against an upper surface of the substrate adjacent to the aperature;
    a plurality of conductive circuit elements formed on the upper surface of the substrate after the terminals have been mounted on the substrate so that a contact end portion of each circuit element overlaps and is attached to the contact head of a selected terminal so as to provide mechanical and electrical connection between the conductive elements and the associated terminals; and
    a second substrate having a plurality of aperatures formed therein, each aperature of the second substrate being positioned such that one or more surfaces of the walls of each aperature make physical contact with the tail section of a terminal when the second substrate is located against the flange depending from the first substrate.

2. An assembly as recited in claim 1 wherein the walls of each of the aperatures positioned in the second substrate are coated with an electrically conductive material to provide electrical contact with an inserted tail section of a terminal.

3. An assembly as recited in claim 1, wherein the contact head section of each terminal comprises a thin flat tab connected to the body section and bent at a 90° angle thereto; and
    the outer surface of the substrate is formed with thin flat pocket adjacent to each aperature and connecting therewith so that the tab fits in the pocket and lies flat in the pocket against the outer surface of the substrate at the base of the pocket.

4. A printed circuit board and contact assembly, which comprises:
    a first planar plastic printed-circuit substrate having an upper and a lower surface with a row of transverse mounting aperatures formed through the substrate along a front edge thereof at spaced positions where external connections to the board are desired, the substrate further having a thin flat pocket formed in the upper surface thereof adjacent to each aperature and connecting therewith;

a flange depending from the lower surface of the first substrate along the front edge of the substrate;

a plurality of L-shaped interconnect terminals mounted in the aperatures so that an elongated leg section of each terminal projects completely through an associated aperature from the upper surface of the first substrate through the lower surface of the substrate to a position projecting beyond the depending flange, and so that a 90° extending flat contact tip section formed at the head end of each terminal fits into the associated pocket and lies flat in the pocket against the upper surface of the substrate at the base of the product, the leg section of each terminal being locked in place within the associated aperture;

a plurality of printed circuit conductors deposited on the upper surface of the substrate in desired patterns after the terminals have been mounted so that an end contact portion each of said conductors overlaps and is bonded to the contact tip of a selected terminal so as to provide mechanical and electrical connection between the printed circuit conductors and the associated selected terminals;

a plurality of thin flat metal conductive strips fastened to the upper surface of the substrate in desired patterns separate and isolated from the printed circuit conductors so that end contact tabs at the front ends of the strips overlap and are welded to the contact tips of other selected terminals so as to provide mechanical and electrical connection between the conductive strips and the associated other selected terminals; and a second planar plastic printed circuit substrate having a row of plated aperatures formed therethrough and positioned to receive the tail end of the elongated legs projecting from the first planar plastic substrate such that each leg, which projects to a position beyond the depending flange, extends into and comes into physical and electrical contact with a wall of an associated aperature in the second substrate when the top surface of the second substrate is brought into contact with a lower surface of the depending flange.

* * * * *